(12) United States Patent
Hosseini et al.

(10) Patent No.: US 9,171,787 B2
(45) Date of Patent: Oct. 27, 2015

(54) PACKAGED SEMICONDUCTOR DEVICE HAVING AN EMBEDDED SYSTEM

(71) Applicant: Infineon Technologies Austria AG, Villach (AT)

(72) Inventors: Khalil Hosseini, Weihmichl (DE); Joachim Mahler, Regensburg (DE); Georg Meyer-Berg, Munich (DE)

(73) Assignee: Infineon Technologies Austria AG, Villach (AT)

( * ) Notice: Subject to any disclaimer, the term of this patent is extended or adjusted under 35 U.S.C. 154(b) by 29 days.

(21) Appl. No.: 13/909,472

(22) Filed: Jun. 4, 2013

(65) Prior Publication Data

US 2014/0353808 A1  Dec. 4, 2014

(51) Int. Cl.
| | |
|---|---|
| H01L 23/495 | (2006.01) |
| H01L 23/48 | (2006.01) |
| H01L 23/52 | (2006.01) |
| H01L 23/04 | (2006.01) |
| H01L 29/40 | (2006.01) |
| H01L 23/02 | (2006.01) |
| H01L 23/34 | (2006.01) |
| H01L 23/14 | (2006.01) |
| H01L 23/31 | (2006.01) |
| H01L 23/00 | (2006.01) |

(52) U.S. Cl.
CPC ........ *H01L 23/49575* (2013.01); *H01L 23/145* (2013.01); *H01L 23/3107* (2013.01); *H01L 23/49513* (2013.01); *H01L 23/49524* (2013.01); *H01L 23/49562* (2013.01); *H01L 24/24* (2013.01); *H01L 2224/04105* (2013.01); *H01L 2224/24245* (2013.01); *H01L 2224/32145* (2013.01); *H01L 2224/32245* (2013.01); *H01L 2224/73267* (2013.01); *H01L 2924/01322* (2013.01); *H01L 2924/12032* (2013.01); *H01L 2924/1301* (2013.01); *H01L 2924/1305* (2013.01); *H01L 2924/13055* (2013.01); *H01L 2924/13091* (2013.01)

(58) Field of Classification Search
CPC .............. H01L 23/49575; H01L 24/24; H01L 23/3107; H01L 23/49513; H01L 23/49562; H01L 23/145; H01L 23/49524; H01L 2924/12032
USPC ......... 257/676, 690, 692, 693, 730, 731, 734, 257/685, 686, 723, 777
See application file for complete search history.

(56) References Cited

U.S. PATENT DOCUMENTS

2014/0027892 A1 *  1/2014  Mahler et al. ................. 257/676

* cited by examiner

*Primary Examiner* — A. Sefer
*Assistant Examiner* — Dilinh Nguyen
(74) *Attorney, Agent, or Firm* — Murphy, Bilak & Homiller, PLLC

(57) ABSTRACT

Disclosed is a packaged device, comprising a carrier comprising a first carrier contact, a first electrical component having a first top surface and a first bottom surface, the first electrical component comprising a first component contact disposed on the first top surface, the first bottom surface being connected to the carrier, an embedded system comprising a second electrical component having a second top surface, an interconnect element, and a first connecting element, the embedded system having a system bottom surface, wherein the system bottom surface comprises a first system contact, wherein the second top surface comprises a first component contact, and wherein the first system contact is connected to the first component contact by the interconnect element and the first component contact of the second electrical component is connected to the first carrier contact by means of the first connecting element.

20 Claims, 3 Drawing Sheets

PACKAGED SEMICONDUCTOR DEVICE HAVING AN EMBEDDED SYSTEM

TECHNICAL FIELD

The present invention relates to a packaged device, and a packaged semiconductor device.

BACKGROUND

The necessity to provide smaller, thinner, lighter, cheaper electronic systems with reduced power consumption, more diverse functionality and improved reliability has driven a stream of technological innovations in all technical fields involved. This is certainly also true for the areas of assembly and packaging, which provide protective enclosure against mechanical and thermal outside influences, as well as against chemical or irradiation-induced damage.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
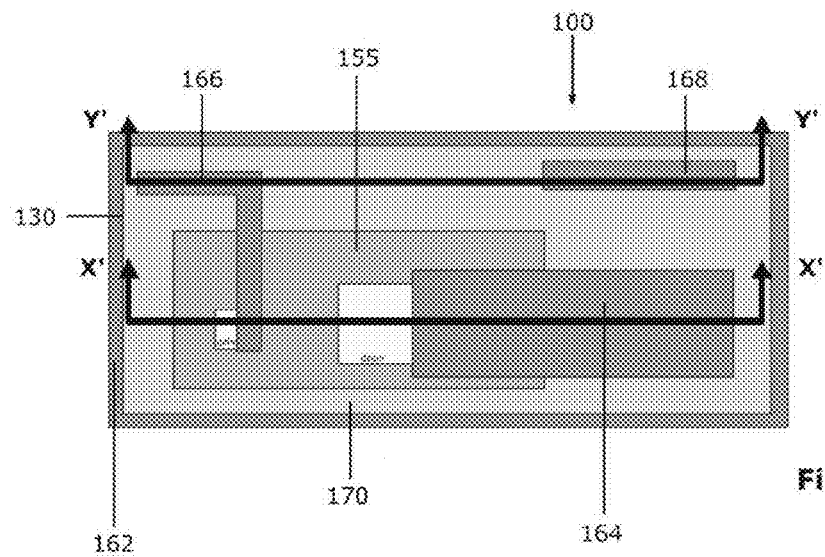
FIGS. 1a-1c illustrate a top view and cross-sectional views across the lines X'-X' and Y'-Y' of an embodiment of how to connect a packaged device comprising a first device with a laminated package clip embedding a second electrical device.

The aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part thereof, and in which is shown by way of illustration specific embodiments in which the invention may be practiced. It may be evident, however, to one skilled in the art, that one or more aspects of the embodiments may be practiced with a lesser degree of the specific details. In other instances, known structures and elements are shown in schematic form in order to facilitate describing one or more aspects of the embodiments. In this regard, directional terminology, such as "top", "bottom", "left", "right", "upper", "lower" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal. The following detailed description, therefore, is not to be taken in a limiting sense, and the scope of the present invention is defined by the appended claims.

The semiconductor chip(s) described further below may be of different types, may be manufactured by different technologies and may include for example integrated electrical, electro-optical or electro-mechanical circuits and/or passives, logic integrated circuits, control circuits, microprocessors, memory devices, etc.

The embodiments of a chip module may use various types of semiconductor chips or circuits incorporated in the semiconductor chips, among them AC/DC or DC/DC converter circuits, power MOS transistors, power schottky diodes, JFETs (Junction Gate Field Effect Transistors), power bipolar transistors, logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures, such as, for example, IGBT (Insulated Gate Bipolar Transistor) structures, or, in general, transistor structures in which at least one electrical contact pad is arranged on a first main face of the semiconductor chip and at least one other electrical contact pad is arranged on a second main face of the semiconductor chip opposite to the first main face of the semiconductor chip. Moreover, the embodiments of insulation materials may, for example, be used for providing insulation layers in various types of enclosures and insulation for electrical circuits and components, and/or for providing insulation layers in various types of semiconductor chips or circuits incorporated in semiconductor chips, including the above mentioned semiconductor chips and circuits.

The semiconductor chip(s) need not be manufactured from specific semiconductor material, for example Si, SiC, SiGe, GaN, GaAs, and, furthermore, may contain inorganic and/or organic materials that are not semiconductors, such as for example insulators, plastics or metals.

The semiconductor chip(s) considered herein may be thin. In order to allow handling or manipulation of the semiconductor chip, e.g., handling/manipulation required for packaging, eWLP (embedded Wafer Level Packaging), or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The devices described below may include one or more semiconductor chips. By way of example, one or more semiconductor power chips may be included. Further, one or more logic integrated circuits may be included in the devices. The logic integrated circuits may be configured to control the integrated circuits of other semiconductor chips, for example, the integrated circuits of power semiconductor chips. The logic integrated circuits may be implemented in logic chips.

The semiconductor chip(s) may have contact pads (or electrodes) that allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected from the group of Cu, Ni, NiSn, Au, Ag, Pt, Pd, an alloy of one or more of these metals, an electrically conducting organic material, or an electrically conducting semiconductor material.

The semiconductor chip(s) may be bonded to a carrier. The carrier may be a (permanent) device carrier used for packaging. The carrier may comprise or consist of any sort of material as, for example, ceramic or metallic material, copper or copper alloy or iron/nickel alloy. The carrier can be connected mechanically and electrically with one contact element of the semiconductor chip(s). The semiconductor chip(s) can be connected to the carrier by one or more of re-flow soldering, vacuum soldering, diffusion soldering, or adhering by means of a conductive adhesive. If diffusion soldering is used as the connection technology between the semiconductor chip(s) and the carrier, solder materials can be used that result in intermetallic phases at the interface between the semiconductor and the carrier, due to interface diffusion processes after the soldering process. In case of copper or iron/nickel carriers it is therefore desirable to use solder materials comprising or consisting of AuSn, AgSn, CuSn, AgIn, AuIn or CuIn. Alternatively, if the semiconductor chip(s) are to be adhered to the carrier, conductive adhesives can be used. The adhesives can, for example, be based on epoxy resins, which can be enriched with particles of gold, silver, nickel or copper to enhance their electrical conductivity.

The contact elements of the semiconductor chip(s) may comprise a diffusion barrier. The diffusion barrier prevents in case of diffusion soldering that the solder material diffuses from the carrier into the semiconductor chip(s). A thin titanium layer on the contact element may, for example, effect such a diffusion barrier.

Bonding the semiconductor chip(s) to the carrier may be done by soldering, gluing, or sintering, for example. In the event that the semiconductor chip(s) are attached by soldering, a soft solder material or, in particular, a solder material capable of forming diffusion solder bonds may be used, such as a solder material comprising one or more metal materials selected from the group of Sn, SnAg, SnAu, SnCu, In, InAg, InCu and InAu.

The semiconductor chip(s) may be covered with an encapsulation material in order to be embedded in an encapsulant (artificial wafer) for eWLP processing or after being bonded to a device carrier (substrate). The encapsulation material may be electrically insulating. The encapsulation material may comprise or be made of any appropriate plastic or polymer material such as, e.g., a thermoplastic or thermosetting material or laminate (prepreg), and may contain filler materials. Various techniques may be employed to encapsulate the semiconductor chip(s) with the encapsulation material, such as compression molding, injection molding, powder molding, liquid molding or lamination. Heat and/or pressure may be used to apply the encapsulation material.

In several embodiments, layers or layer stacks are applied to one another, or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole, such as, for example, laminating techniques, as well as techniques in which layers are deposited in a sequential manner, such as, for example, sputtering, plating, molding, CVD, etc.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described in a specific context, namely as a packaged half-bridge circuit comprising two power semiconductor transistors. However, embodiments of the present invention may also be applied to other device types of circuits and devices.

An embodiment of the invention provides a laminated package as an electrical connection element between a component contact of a first electrical component and a carrier contact of a carrier. A second component may be embedded in the laminated package. A package contact of the laminated package may be connected via a connecting element to a further carrier contact. In one embodiment the laminated package comprises a prepreg material. An advantage of embodiments of the invention is a further reduction in package and footprint size. Another advantage is a further reduction in overall electrical path lengths of interconnects, since longer interconnects may cause capacitive losses, inductive losses, higher power consumption and signal latencies.

Figure 1B:
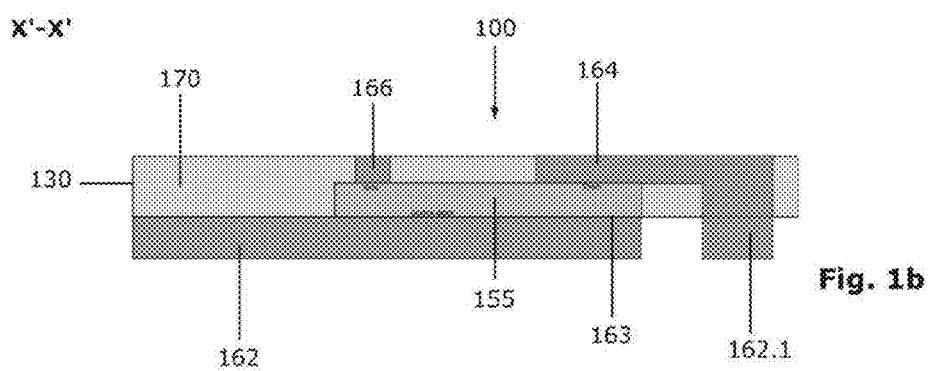
Figure 1C:
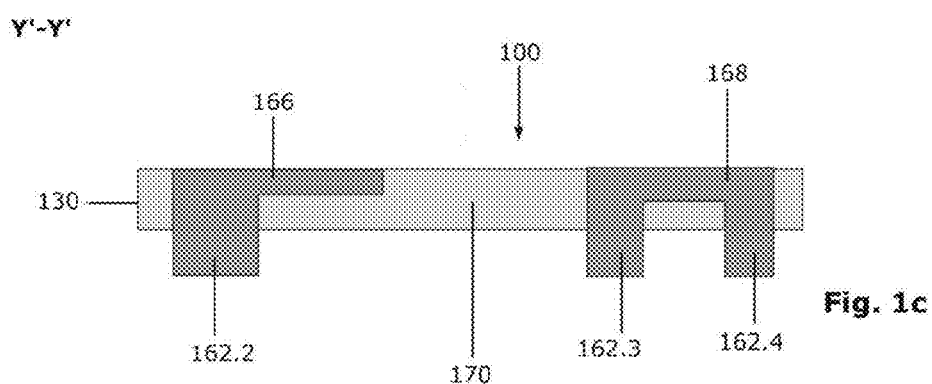

FIGS. 1a-1c show an embodiment of an embedded system 100 in a stage where it is attached to the component device (not shown).

In this embodiment the embedded system 100 comprises a component package 130 and the component package 130 comprises a laminate 170 as encapsulation material. The laminate 170 may comprise alternating layers of conducting and non-conducting (insulating) materials. The insulating material may comprise prepreg, which is a porous glass fiber film. The prepreg may be impregnated with bisphenol-A resin and hardener components. The conductive materials may comprise metals or metal alloys. For example, the conductive materials may be copper (Cu) or aluminum (Al).

The laminate 170 comprises a plurality of material layers. For example, a laminate comprises conductive (comprising conductive path and traces) and non-conductive layers is a comprising a polymeric material(s) reinforced with glass or carbon fibers and sometimes additionally filled with inorganic particles such as $SiO_2$, $Al_2O_3$ or similar materials. Each layer comprises a thickness of about 10 μm to about 1,000 μm. Alternatively, the component package 130 may comprise other encapsulation materials.

The component package 130 comprises an electrical component 155 which may be a chip (or die), for example. The component 155 comprises a substrate. The substrate may be a semiconductor substrate such as silicon or germanium, or a compound substrate such as SiGe, GaAs, InP or GaN, SiC, or alternatively other materials. The semiconductor substrate may be a single-crystal silicon or a silicon-on insulator (SOI). One or more interconnect metallization layers may be arranged on the substrate. A passivation layer is disposed on the top surface of the metallization layers defining component contacts or component contact pads. The passivation layer may comprise SiN, for example.

The chip 155 may comprise a discrete device such as a single semiconductor device or an integrated circuit (IC). For example, the chip 155 may comprise a power semiconductor device such as a bipolar transistor, an insulated gate bipolar transistor (IGBT), a power MOSFET, a thyristor or a diode. Alternatively, the chip 155 may be a component such as a resistor, a protective device, a capacitor, a sensor or a detector, for example.

The component 155 has a first component contact or first component contact pad disposed on its top surface. The component 155 may further comprise a second component contact or second component contact pad on the top surface. The component 155 may finally comprise a third component contact or third component contact pad on the top surface or the bottom surface. Alternatively, the component 155 may have other and/or different contact pad arrangements on its top and bottom surfaces.

The component package 130 may comprise connection element 162. The connection element may be a conductive interconnect, a conductive trace, a conductive redistribution layer, or a second carrier. The component package 130 may comprise second component package contacts 164, 166, 168 connected to the component contacts of the component 155.

In one embodiment, the connection element 162 is a leadframe. The leadframe 162 may comprise leadframe contact pads or leads and a component attach region 163. The leadframe 162 may comprise a conductive material such as a metal. For example, the leadframe 162 may comprise copper and/or nickel. The leadframe 162 may further comprise leadframe contacts 112.1, 162.2, 162.3 and 162.4. The laminate material 170 may be deposited onto the leadframe 162 and the component 155, and thereafter openings may be formed in the laminate material above the leadframe contacts 162.1-162.4 and the upper surface of the component 155. Thereafter a conductive is deposited into the openings by, for example electroplating or electroless plating. In this way the second component package contacts 164, 166 and 168 are formed.

The component 155 is attached to the leadframe 162 at the die attach area 163. For example, the bottom surface of the component 155 is attached to the top surface of the leadframe 162. The component 155 is attached with a die attach connection. For example, the main surface of the component 155 is bonded to the top surface of the leadframe 162 using a eutectic bonding or an epoxy bonding. Alternatively, the main surface of the component 155 is bonded, glued, soldered by diffusion soldering or connected by a nano-paste to the top surface of the leadframe 162 using an adhesive tape, a solder paste or a solder. Depending on the specific configuration the component attach connection may be an electrical connection or may be an insulating barrier.

In one embodiment, the component 155 is a power semiconductor switch or a transistor having a drain contact and a gate contact at the top surface of the component 155 and the source contact at the bottom surface. The gate contact of the power semiconductor switch is connected to the component package contact 166 via a trace in the laminate 170, the drain contact of the power semiconductor switch is connected to the component package contact 164 via a trace in the laminate 170 and the source contact of the power semiconductor switch is directly connected to the leadframe 162.

Figure 2A:
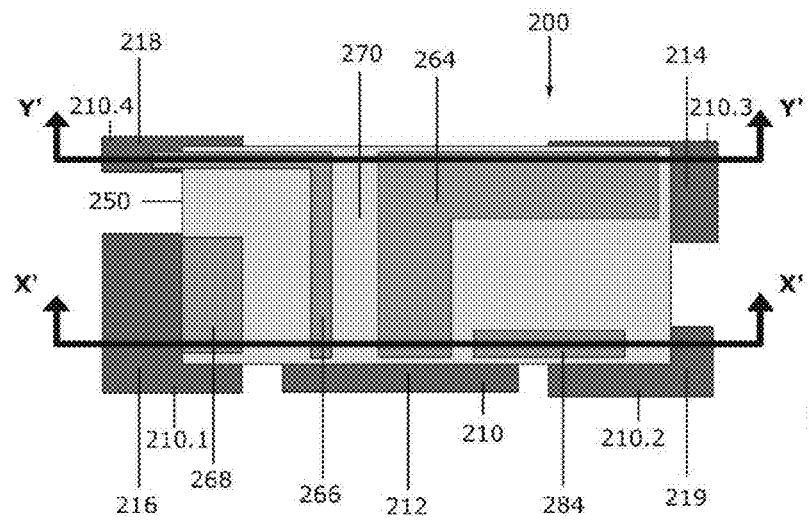
FIGS. 2a-2c illustrate a top view and cross-sectional views across the lines X'-X' and Y'-Y' of another embodiment of a half-bridge circuit comprising two semiconductor devices connected by the multifunctional contact clip.
Figure 2B:
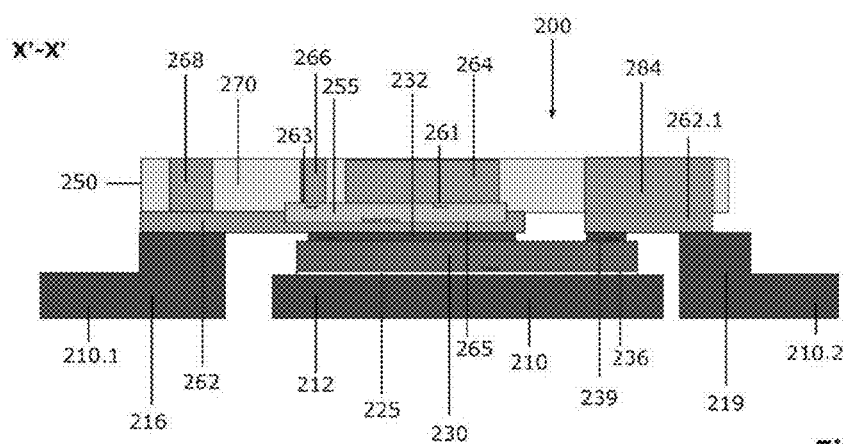
Figure 2C:
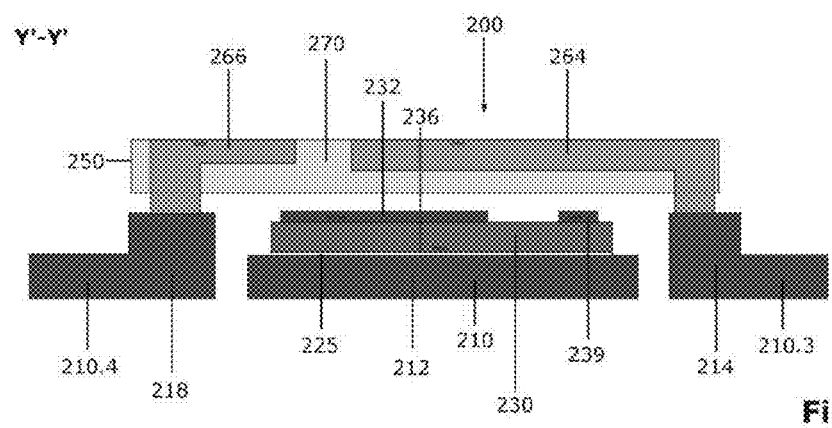

FIGS. 2a-2c show an embodiment of a packaged electrical device 200. The packaged electrical device may be a half-bridge circuit. The packaged electrical device comprises a first component such as power transistor chip 230 and an embedded system 250 comprising a second component such as a second power transistor chip 255. The first component 230 is mechanically and electrically connected to a carrier contact 216 through the embedded system 250.

FIGS. 2a-2c show an embodiment of an electrical component package 200 (e.g., a half-bridge circuit). The first component 230 of the electrical component package comprises a first contact such as a source contact 232 and a second contact such as gate contact 239 on the upper or first main surface and a third component contact such as the drain contact 236 on the lower or second main surface opposite the main surface. The third component contact (e.g., drain contact) 236 is mechanically and electrically connected to a die attach region 212 of the carrier such as a metallic leadframe 210, which further comprises leadframe contacts 210.1, 210.2, 210.3 and 210.4, via a backside metallization (BSM) layer 225. The BSM layer 225 may comprise barrier layers such as Cr, Ti or Ta layers, which protect the first component 230 against undesired metal atom diffusion into the component, and a layer (or a stack of layers) of metals such as Au, Ag or Cu layers which may exhibit a high coefficient of diffusion into the metallic leadframe 210. The second contact 239 is connected to the carrier contact 219 (e.g., lead) via a trace 284 in the laminate 270 of the embedded system 250.

The first component contact 232 of the component 230 is connected to the carrier contact 216 through the connection element 250 (embedded system). The connection element 250 comprises a second component such as a second power transistor chip 255, an interconnect element such as a conductive interconnect 262, conductive trace, redistribution layer or a leadframe, and a encapsulation material (e.g., laminate) 270. The second component 255 comprises a first contact 261 such as the drain contact and a second contact 263 such as the gate contact on the second top surface of the second component 255 and a third contact 265 such as the source contact on the second bottom surface opposite the first main surface of the second component 255. The interconnect element 262 of the embedded system 250 provides multi-fold functionality.

The interconnect element 262 is electrically connected to the first component contact 232 (e.g., source contact) of the first component 230 and the third contact 265 (e.g., source contact) of the second component 255. Moreover, the interconnect element 262 provides a conductive connection between the component contacts 232, 265 and the carrier contact (e.g., lead) 216. Finally, the interconnect element 262 together with the trace 268 through the laminate 270 establishes a conductive path to the top surface of the embedded system 250, thereby providing an interconnection route to external circuits.

The first component contact 261 of the second component 255 is electrically connected to the carrier contact (e.g., lead) 214 through the component package contact 264, and the second component contact 263 of the second component 255 is electrically connected to the carrier contact (e.g., lead) 218 through the component package contact 266.

The electrical component package 200 may further comprise an encapsulant (not shown). The encapsulant encapsulates the first component 230 with an encapsulation material. The encapsulant may further encapsulate (or partially encapsulates) the connection element 250 (embedded system) and the carrier 210.

The encapsulation material of the encapsulant may be a molding compound or a laminate. In one embodiment the encapsulation material may be a different material than the encapsulation material of the embedded system 250. For example, the encapsulation material of the embedded system 270 may be a laminate and the encapsulation of the encapsulant may be a molding compound.

The encapsulation material of the encapsulant may comprise thermosetting materials such as an epoxy, polyurethane or polyacrylate compound. Alternatively the encapsulation material may comprise thermoplastic materials such as polysulfones, polyphenylen sulfides, or polyetherimides. In one example, the encapsulation may comprise a polyimide such as a Si-modified polyimide.

Since the electrical component package 200 may provide modular characteristics, several extended configurations are possible. For example, a third component may be disposed on the electrical component package 200. In another example, a heat sink may be disposed on the top surface of the embedded package 250 promising effective and improved heat management.

Figure 3:
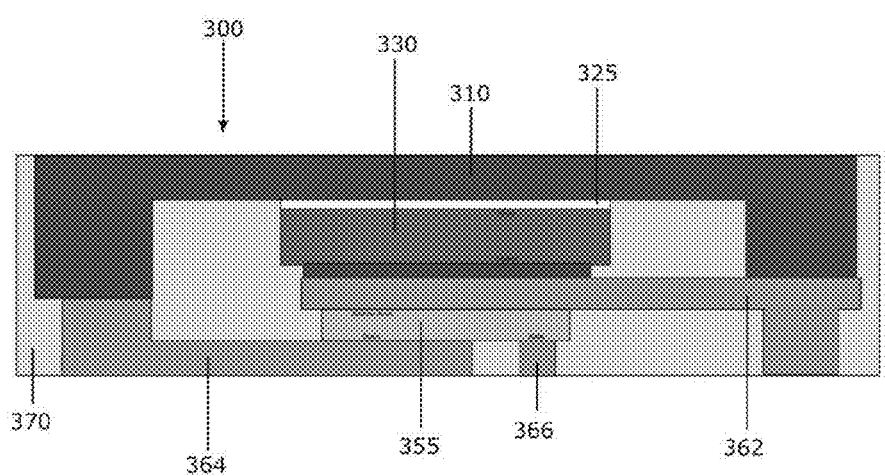
FIG. 3 illustrates a cross-sectional view of yet another embodiment of a packaged device directly connected to a circuit board by the multifunctional contact clip.

FIG. 3 shows an embodiment of a component package in which the package is connected directly to a circuit board, in order to allow for improved heat management of the comprised devices.

In this embodiment a circuit board 310 is provided and a first electrical component such as a first power transistor chip 330 is connected to the circuit board 310 via a backside metallization layer (BSM) 325. A metal substrate 362 is mechanically and electrically connected to the source contact 332 of the first power transistor 330. To this metal substrate 362 a second electrical component such as a second power transistor 355 is connected mechanically and electrically. Finally, the connecting element 364 is attached to the second electrical component 355 to directly connect the second electrical component 355 to the circuit board 310. This assembly is then encapsulated by an encapsulant such as a laminate 370 comprising traces for the deposition of electrical connection elements such as the gate electrode 366 and/or other connection elements (not shown), thereby providing an interconnection route to external circuits.

A fourth embodiment provides for the mechanical and electrical connection of two already encapsulated electrical devices such as first and second power transistors by the above-described connection element of this invention to build a packaged electrical device, such as, for example a half-bridge circuit.

For the different embodiments of the packaged electrical devices shown in FIGS. 1-3 the mechanical connection may involve bonding metal to metal surfaces. There are several methods to join metallic interfaces. In one embodiment a conductive adhesive is applied. The conductive adhesive may comprise thermoplastic or thermosetting resins (e.g. epoxy compounds, polyimides, modified silicones) which contain a large volume (up to 80%) of highly conductive flakes of Ag, Ag-plated Cu, Ni or Au. The size of the conductive flakes may be in the range of tens of µm. Conductive adhesives can be screen printed, stencil printed, dot placed or dispersed on the interface to be connected. After the application of the conductive adhesive, the layers are cured for a few minutes at temperatures ranging from 100° C. to 250° C.

In another embodiment, nanopaste products are employed. Nanopaste products comprise metallic inks having particles of Ag or Au which measure a few tens of nm in size. Nanopastes may be applied to a substrate by an inkjet printer. Bond formation between the contact interfaces occurs by sintering of the nanopastes (for example at 220° C.-250° C., under a pressure of 1-5 MPa, for 1-2 min).

In a further embodiment, solder techniques are applied. Solder materials such as Pb/Sn and Au/Sn can be used. Solder techniques may include diffusion soldering, also known as solid-liquid inter-diffusion bonding. With diffusion bonding a metallic thin-film interlayer is employed, which melts at low temperatures and reacts rapidly with the metals of higher melting interface layers to form one or more intermetallic phases. These intermetallic compounds (IMCs) have distinctly higher melting points than the original low-melting interface. Thus, the joint will not re-melt thereafter unless it is heated to a higher temperature at which one of the intermetallic phases melts. AuSn, AgSn, CuSn and AgIn are frequently used for diffusion soldering. Soft soldering and diffusion soldering may be carried out at temperatures of 300-400° C., or at temperatures below 350° C. In some embodiments, lower processing temperatures are desirable to better guarantee the integrity of the laminate architecture. Formation of solder connections at a temperature below 250° C. becomes possible by applying batch soldering/curing under pressure in an oven.

In one embodiment a Reactive Nano Technology (RNT) bonding may be applied to join two metallic interfaces in the presence or absence of a solder material. RNT bonding relies on the presence of 1-30 nm thick reactive nanoscale bilayers of alternating elements like Ni/Al, Al/Ti or Ti/a-Si. A self-propagating exothermic intermixing process between the different metals in the nanostack may be ignited at the periphery of the reactive layer by a local heat pulse, a laser pulse or an electrical pulse. The heat released by the exothermic reaction induces inter-diffusion processes between the metallic faces to be joined. Applying a bonding pressure of a few MPa, bonding of contact faces may occur within milliseconds. The heat created by the self-propagating reaction remains localized close to the contact interface and does not penetrate too much into the bulk of the metallic counter-faces to be joined.

In one embodiment Nanovelcro technology may be applied to bond metallic interfaces without applying a solder. With this bonding technique, thin layers comprising conductive carbon nanotubes are applied to the contact interfaces to be joined. The two contact layers are enmeshed under pressure forming electrical and mechanical contacts without the application of solder.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention.

Accordingly, the appended claims are intended to include within their scope such processes, machines, manufacture, compositions of matter, means, methods, or steps.

What is claimed is:

1. A packaged device, comprising:
   a carrier comprising a first carrier contact;
   a first electrical component, the first electrical component having a first top surface and a first bottom surface, the first electrical component comprising a first component contact disposed on the first top surface, the first bottom surface being connected to the carrier;
   an embedded system comprising a second electrical component, an interconnect element, and a first connecting element, the embedded system having a system bottom surface, wherein the system bottom surface comprises a first system contact, and the second electrical component having a second top surface, wherein the second top surface comprises a first component contact, wherein
   the first system contact is connected to the first component contact by the interconnect element and the first component contact of the second electrical component is connected to the first carrier contact by means of the first connecting element.

2. The packaged device according to claim 1, wherein:
   the embedded system comprises a second connecting element;
   the carrier has a second carrier contact; and
   the first electrical component has a second component contact on the first top surface, wherein
   the second component contact of the first electrical component is connected to the second carrier contact by means of the second connecting element.

3. The packaged device according to claim 2, wherein:
   the carrier comprises a component attach region and the first electrical component comprises a third component contact on the first bottom surface, and wherein
   the third component contact of the first electrical component is electrically connected to the component attach region of the carrier.

4. The packaged device according to claim 3, wherein the first electrical component is a first transistor, wherein the first component contact is a first source contact of the first transistor, wherein the second component contact is a first gate contact of the first transistor, and wherein the third component contact is a first drain contact of the first transistor.

5. The packaged device according to claim 4, wherein the second electrical component is a second transistor, wherein the second transistor comprises a second top surface and a second bottom surface, wherein a second source contact is arranged on the second bottom surface, and wherein a second drain contact and a second gate contact is arranged on the second top surface.

6. The packaged device according to claim 5, wherein the first source contact and the second source contact are electrically connected.

7. The packaged device according to claim 6, wherein:
   the carrier comprises a third carrier contact and a fourth carrier contact;
   the embedded system comprises a third connecting element and a fourth connecting element;
   wherein the third connecting element connects the second gate contact to the third carrier contact, and wherein the fourth connecting element connects the second drain contact to the fourth carrier contact.

8. The packaged device according to claim 3, wherein the first electrical component is a first transistor, wherein the first component contact is a first drain contact of the first transistor, wherein the second component contact is a first gate contact of the first transistor, and wherein the third component contact is a first source contact of the first transistor.

9. The packaged device according to claim 8, wherein the second electrical component is a second transistor, wherein the second transistor comprises a second top surface and a second bottom surface, wherein a second source contact and a second gate contact is arranged on the second bottom surface, and wherein a second drain contact is arranged on the second top surface.

10. The packaged device according to claim 9, wherein the first drain contact and the second drain contact are electrically connected.

11. The packaged device according to claim 10, wherein the carrier comprises a third carrier contact and wherein the packaged device further comprises a third connecting element, wherein the third connecting element connects the second gate contact to the third carrier contact.

12. The packaged device according to claim 1, wherein the embedded system comprises the second component, the interconnect element and the first connecting element embedded in a laminate material.

13. The packaged device according to claim 1, wherein the carrier further comprises a second carrier contact, wherein the first electrical component comprises a second component contact on the first top surface, wherein the embedded system comprises a second system contact on the system bottom surface, and wherein the second system contact is electrically connected to the second component contact and the second system contact is electrically connected to the second carrier contact.

14. A packaged semiconductor device, comprising:
    a carrier comprising a first carrier contact;
    a first electrical component, the first electrical component having a first top surface and a first bottom surface, the first electrical component comprising a first component contact disposed on the first top surface, the first bottom surface being connected to the carrier;
    an embedded system comprising a second electrical component, and an interconnect element comprising a first interconnect element contact and a second interconnect element contact, and a first connecting element,
    the embedded system having a system bottom surface, wherein the system bottom surface comprises a first system contact, and the second electrical component comprises a second component contact, wherein
    the first system contact is connected to the first component contact by the first interconnect element contact, and the second component contact is connected to the first carrier contact by the second interconnect element contact and the first connecting element.

15. The packaged semiconductor device according to claim 14, wherein the embedded system comprises the second electrical component, the interconnect element and the first connecting element embedded in a laminate material.

16. The packaged semiconductor device according to claim 15, wherein the laminate material comprises a prepreg material.

17. The packaged semiconductor device according to claim 15, wherein the embedded system comprises a second connecting element embedded in the laminate material.

18. The packaged semiconductor device according to claim 14, wherein the first electrical component and the second electrical component are power transistors.

19. The packaged semiconductor device according to claim 14, wherein the first electrical component and the second electrical component are connected in series.

20. The packaged semiconductor device according to claim 14, wherein the carrier and the interconnect elements are leadframes.

* * * * *